US006736949B2

(12) United States Patent
Shi et al.

(10) Patent No.: US 6,736,949 B2
(45) Date of Patent: May 18, 2004

(54) FILTERED CATHODE ARC SOURCE DEPOSITION APPARATUS

(75) Inventors: Xu Shi, Singapore (SG); Beng Kang Tay, Singapore (SG); David Ian Flynn, Singapore (SG); Hong Siang Tan, Selangor (MY); Michael Fulton, Singapore (SG)

(73) Assignee: Filplas Vacuum Technology Pte Ltd. (SG)

( * ) Notice: Subject to any disclaimer, the term of this patent is extended or adjusted under 35 U.S.C. 154(b) by 0 days.

(21) Appl. No.: 10/014,387

(22) Filed: Dec. 11, 2001

(65) Prior Publication Data

US 2003/0085123 A1 May 8, 2003

(Under 37 CFR 1.47)

Related U.S. Application Data

(63) Continuation-in-part of application No. 08/894,419, filed as application No. PCT/GB96/00390 on Feb. 20, 1996, now abandoned.

(30) Foreign Application Priority Data

Feb. 20, 1995 (GB) ................................................ 9503304

(51) Int. Cl.$^7$ ............................................... C23C 14/32
(52) U.S. Cl. ................................................. 204/298.41
(58) Field of Search ....................... 204/298.41, 298.23, 204/298.25, 298.26, 192.38; 250/429.21

(56) References Cited

U.S. PATENT DOCUMENTS

| 3,676,320 A | * | 7/1972 | Christensen ........... 204/192.12 |
| 5,103,766 A | * | 4/1992 | Yoshikawa et al. ... 118/723 VE |
| 5,234,561 A | * | 8/1993 | Randhawa et al. .... 204/192.38 |
| 5,279,723 A | * | 1/1994 | Falabella et al. ...... 204/192.38 |
| 5,433,836 A | * | 7/1995 | Martin et al. .......... 204/298.41 |
| 5,480,527 A | * | 1/1996 | Welty ..................... 204/192.38 |
| 5,571,331 A | * | 11/1996 | Schertler et al. ............ 118/719 |

* cited by examiner

Primary Examiner—Gregg Cantelmo
(74) Attorney, Agent, or Firm—Kirschstein et al.

(57) ABSTRACT

Deposition apparatus incorporating either a single or multiple filtered cathodic arc (FCA) source for depositing coatings such as tetrahedral amorphous carbon (TAC); metal oxides; compounds and alloys of such materials onto various types of substrates, such as metals semiconductors, plastics ceramics and glasses. Substrates are moved through the plasma beam(s) of the FCA source(s) and beam scanning increases deposition area. Macroparticles are filtered by a double bend filter duct.

19 Claims, 9 Drawing Sheets

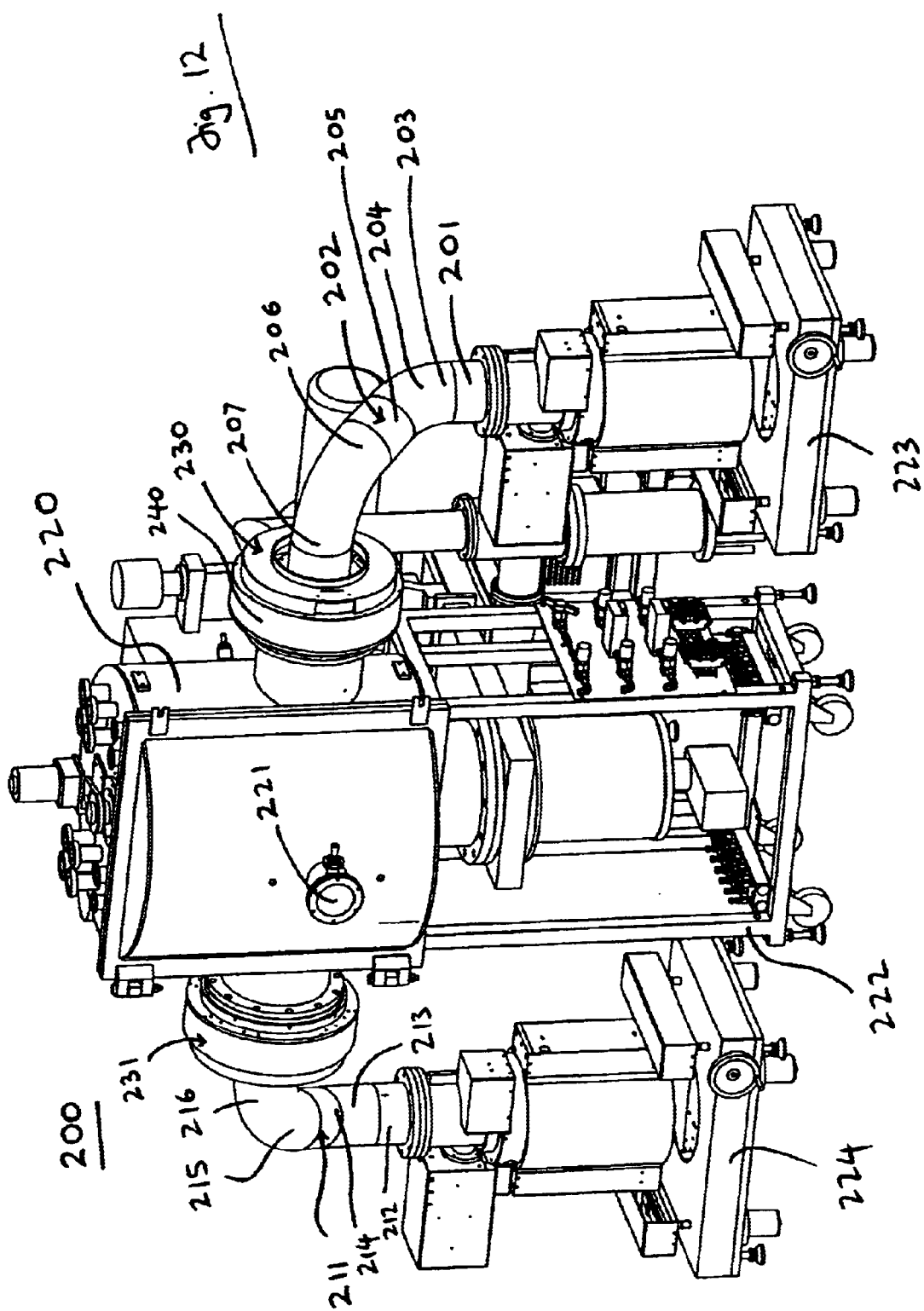

FILTERED CATHODE ARC SOURCE DEPOSITION APPARATUS

CROSS REFERENCE TO RELATED APPLICATIONS

This application is a continuation-in-part of U.S. patent application Ser. No. 08/894,419, filed Nov. 21, 1997, now abandoned which is a 371 of PC7/GB96/003916 filed Feb. 20, 1996.

BACKGROUND OF THE INVENTION

The present invention relates to deposition apparatus. Specifically, the invention relates to apparatus and processes for deposition of optical quality coatings such as: tetrahedral amorphous carbon (TAC); metal oxides, nitrides, hydrides, carbon-containing compounds; and other compounds and alloys of metals.

Various methods are known in the prior art for depositing thin-films on substrates. In the field of physical vapor deposition, with which the invention is concerned, these methods include various sputtering techniques such as RF or magnetron sputtering, and the use of filtered cathodic arc sources of positive ions.

U.S. Pat. No. 4,851,095 describes apparatus and process for magnetron sputtering to obtain thin coatings on a range of substrates. Magnetron sputtering can produce a broad beam of coating particles and is thus a suitable technique for the coating of large substrate areas. To date, the films produced by magnetron sputtering are not of sufficient quality in terms of hardness, uniformity and smoothness to be suitable for commercial production of coatings for optical equipment. U.S. Pat. No. 4,851,095 also describes a coating chamber that incorporates a rotatable drum on which is mounted substrates to be coated.

Deposition of coatings using a filtered cathodic arc source is also known in the art, and reviewed by P. J. Martin in Surface Engineering, Volume 9, (1993) No. 1, pages 51–57.

Filtered cathodic arcs known in the art are typically used for short periods of time, or in pulsed and non-continuous mode for coating individual substrates one at a time. The problems associated with commercial use of this technology have not been solved. Further, known filtered cathodic arc sources typically produce a plasma beam no more than 3 cm in diameter. This is not a suitable size for coating large substrate areas.

Neither known physical vapour deposition or chemical vapour deposition techniques have previously been considered suitable for use on a commercial scale.

There has thus been appreciated the need to be able to deposit high quality thin films on substrates in a commercial process using apparatus that can be used continuously for relatively long periods of time.

SUMMARY OF THE INVENTION

It is an object of the invention to provide deposition apparatus for commercial deposition of high quality thin films onto substrates. It is another object of the invention to provide deposition apparatus for deposition of high quality thin films onto large substrate areas. A further object of the invention is to provide deposition apparatus for applying multi-layer coatings onto substrates.

These objects are achieved at least in part by the combination of a coating chamber and a filtered cathodic arc source.

According to the invention there is provided apparatus for applying a coating of positive ions to a substrate comprising:
a vacuum chamber,
a filtered cathodic arc source providing a plasma beam containing the positive ions,
a substrate to be coated, and
a substrate holder,
wherein the substrate holder is adapted to move the substrate across the beam of positive ions thereby to coat the substrate with the positive ions.

In an embodiment of the invention, the apparatus comprises magnetic means for scanning the plasma beam over a coating area greater than the area of the plasma beam.

The invention thus enables a large area of substrate to be coated as the substrate is moved through the beam of positive ions generated by the filtered cathodic arc. This enables efficient commercial scale deposition of positive ions onto substrates. By scanning the plasma bean into a coating area of greater size than the area of the plasma beam emitted from the filtered cathodic arc, coating of substrate over an especially large surface area is enabled. Further, the coating beam is necessarily of lower density than the smaller area plasma beam prior to scanning. Therefore, the deposition rate of the scanned beam is lower than the deposition rate of an unscanned beam and deposition on the substrate occurs more slowly. This enables greater control over the depth of deposition on the substrate.

In an embodiment of the invention, the substrate holder is adapted for rotation of the substrate through the plasma beam. In a preferred embodiment, the substrate holder is a rotatable drum and the substrate is mounted on the inner or outer periphery of the drum.

In use of this embodiment immediately above described, one or a plurality of substrates are mounted on the drum periphery and by rotation of the drum while a plasma beam is generated from the filtered cathodic arc a layer of positive ions is deposited onto each substrate in turn as it passes through the plasma beam, which is preferably scanned into a coating beam. The rate of deposition of positive ions onto the substrates is conveniently monitored using techniques known in the art, for example using a crystal rate monitoring system.

In a particular embodiment of the invention the rate of deposition on the substrate is monitored and this deposition information is fed back into the magnetic beam scanning apparatus so as to control the rate of deposition on any particular area of the substrate.

In a further embodiment of the invention, scanning of the plasma beam occurs downstream of filtering of the plasma beam by the filtered cathodic arc source. In another embodiment of the invention the magnetic scanning means scans the plasma beam in a raster scan. The width of the raster is preferably at least 10 cm wide, more preferably at least 20 cm wide and most preferably at least 30 cm wide.

The apparatus of the invention uses a filtered cathodic arc source for continuous coating of one or a plurality of substrates with positive ions from a target at the cathode of the cathode arc source. This is made possible by the filtered cathodic arc source being suitable for continuous use without overheating. This can be achieved by the provision of a water-cooled anode and a water-cooled cathode in the filtered cathodic arc source, making the source suitable for continuous or long term use. Typically, for a filtered cathodic arc source, continuous use means use for a period of at least 3 minutes, but can also mean use until the target, located at the cathode and from which the positive ions in the coating beam are generated, is substantially consumed. As will be appreciated by a person of skill in the art, complete consumption of the target material is rare as contamination of the plasma beam by ions generated from the cathode material is preferably to be avoided; in practice the target is generally not allowed to be consumed beyond a point at which there is a risk of contaminating the plasma by arcing directly between cathode and anode.

A particularly preferred filtered cathodic arc source for use in the apparatus of the invention is described and claimed in a co-pending International patent application Publication No. WO 96/26531, which corresponds to U.S. Ser. No. 08/894,420, filed Nov. 21, 1997, now U.S. Pat. No. 6,031,239.

In a particularly preferred embodiment of the invention suitable for applying multi-layer coatings of positive ions to a substrate, the apparatus further comprises at least a second filtered cathodic arc source providing a plasma beam containing positive ions, and a substrate holder adapted to move the substrate across the beams from the respective filtered cathodic arc sources.

In use of an embodiment of the invention, a first filtered cathodic arc source is used to place a first coating layer on a substrate; subsequently, this first cathodic arc source is stopped and a second cathodic arc source is used to place a second layer of a different material onto the substrate. This technique is advantageously used to deposit multi-layer coatings onto optical elements. A multi-layer coating made using the invention comprises a first layer of tetrahedral amorphous carbon, a second layer of silicon dioxide, a third layer of tetrahedral amorphous carbon and a fourth layer of silicon dioxide. Another optical coating obtainable using the apparatus of the invention has a first layer of aluminum oxide, a second layer of tetrahedral amorphous carbon and a third layer of silicon dioxide. Other combinations of coatings in multi-layer coatings will be apparent to the practitioner.

Multi-layer coatings are also achieved in another embodiment of the invention in which deposition apparatus comprises a filtered cathodic arc source and the source has at least two cathode targets, one in a vacuum chamber at a cathode station from which an arc can be generated and the other or others stored away from the cathode station. The cathode targets are interchangeable without breaking vacuum in the chamber. Means for interchanging the cathode targets conveniently comprises a cathode gripper mounted on an arm and moveable between the cathode station and the stored cathode target or targets, which may be in a cathode magazine.

Scanning of the plasma beam can be achieved by scanning techniques known and appreciated in the art. For example, a magnetic scanner using a soft magnetic core can be used with a scanning frequency of 2–100 Hz.

In a particular embodiment of the invention, the plasma beam is scanned in two dimensions using magnetic fields scanned perpendicular to each other. This scanning technique produces a coating beam that is two dimensional in area and can be used in the coating apparatus of the invention. By monitoring the rate of deposition on the substrate and actively feeding back this deposition rate information to the scanning apparatus coatings of excellent uniformity are achieved. An embodiment of the invention uses electronic scanning control means. This control means is pre-programmed with a pre-determined rate of deposition for separate areas of the substrate. The rate of deposition in each area of the substrate is monitored, this information is fed back to the scanning control means and the scanning is adjusted so as to obtain the desired rate of deposition in each deposition area.

In embodiments of the invention, when carrying out scanning of the beam in two dimensions, a typical arrangement is a scanning frequency of about 50 Hz in one dimension and about 2 Hz in the other dimension. As will be appreciated by a person of skill in the art, scanning of the beam using frequencies that are chosen so that the frequency in one dimension is significantly different to the frequency in the other dimension gives a paint brush type scanning pattern. When frequencies are chosen so as to be similar in both dimensions, the result is typically a pronounced scanning pattern. Synchronized scanning frequencies in both dimensions produces Lissajous figures.

In typical use of deposition apparatus according to the invention, the plasma beam in scanned rapidly in one dimension only, at a scanning frequency typically of at least 20 Hz, preferably around 40–80 Hz. A convenient frequency is that of mains electricity, namely around 50 Hz. Scanning in one dimension is combined with movement of the substrate across the scanned beam, a substrate being mounted on the periphery of a rotating drum. A typical rotation produces substrate movement in the range of 0.1 m/s to 10 m/s. It is convenient to arrange the scanning frequency so as to be approximately 10 times that of the rotating drum.

It is particularly preferred to scan the plasma beam in one dimension only. This enables the dimensions of the duct containing the scanned plasma beam to be fan-shaped and enables the scanning mechanism to be approached close to the plasma beam inside the plasma duct.

The use of a scanned plasma beam confers considerable advantages over prior art magnetron sputtering devices as these devices generate atoms of coating material which are neutrally charged and cannot be scanned. The scanning mechanism of the preferred embodiment of the invention enables precise user control of the rate of deposition on the substrate as well as precise control over the deposition profile for the surface of a substrate.

In another embodiment of the invention the apparatus comprises means for biasing the substrate to a pre-determined positive potential. Preferably, the substrate is biased to a potential within a certain range, preferably to within 10V-30V. It is preferred to control the positive bias on the substrate to control the energy of positive ions arriving at the substrate and thereby to alter the properties of the deposited layer.

For optical elements and other dielectric substrates, RF means can be used to provide the appropriate biasing.

Using apparatus according to the invention it is possible to deposit high quality films of tetrahedral amorphous carbon from a graphite target. It is known that such high-quality films are typically compressively stressed. In a preferred embodiment of the invention a substrate is coated with both a layer of tetrahedral amorphous carbon that is compressively stressed and also a layer of a coating that is tensile stressed, such as aluminium oxide ($Al_2O_3$), zinc sulphide ($ZnS_2$) or zinc selenide ($ZnSe_2$).

In a particularly preferred embodiment described in detail below, the invention uses a cylindrical processing configuration in which substrates are mounted on a rotating cylindrical drum carrier. The substrates are moved past a set of processing stations comprising filtered cathode arc (FCA) sources alternately to deposit single thin-film layers of a particular material which culminates in a complete multi-layer thin-film system.

The substrates are optionally electrically biased with a DC or RF system that confers an acceleration potential for the discharged ions emerging from the FCA source. Also, this arrangement is scalable in that a multiple number of FCA sources can be installed to deposit over a larger substrate area. As one example, three FCA sources are arranged to sequentially deposit TAC, Aluminum Oxide, and Silicon Dioxide to form an anti-reflective coating on either plastic or glass substrates. As another example two or more FCA sources are adapted to operate simultaneously with targets of the same material to deposit a coating on a substrate, or plurality of substrates, at increased rate.

Another aspect of the invention provides apparatus for applying a coating of positive ions onto a dielectric substrate, the apparatus comprising:

means for generating an arc at a cathode target, the cathode target containing the ions to be deposited on the dielectric substrate, magnetic means for directing a beam of ions emitted from the cathode along a filter path substantially to remove macroparticles therefrom, means for holding the dielectric substrate in the filtered ion beam, and means for applying RF bias to the optical element to dissipate electrostatic charge accruing on the element by deposition of positive ions.

The apparatus of the invention, incorporating the FCA deposition sources provides rapid, uniform deposition of optical quality coatings on both flat and curved parts. The efficiency of the FCA deposition system provides high deposition rates coupled with the thermal and deposit spread over a large substrate surface area permitting high rate of thin-film synthesis on plastic and other temperature-sensitive materials.

By adjusting the starting material, deposition rate, reactive gas type, and substrate bias we can deposit films consisting of precise stoichiometry and composition.

A particular aspect of this invention, as compared to other systems, is the ability to deposit tetrahedral amorphous carbon (TAC), or "diamond like carbon" (DLC), on ambient temperature substrates. The quality of this film exceeds other DLC films deposited at elevated temperature in terms of hardness, thermal conductivity, refractive index, and surface smoothness. TAC in combination with other materials provides a unique technology for depositing multi-layer thin-films onto a variety of shapes and temperature-sensitive substrates.

Specific embodiments of the invention combine FCA deposition sources and a rotary cylindrical work-piece support to provide a deposition system which is capable of high rate synthesis of single or multi-layer optical films of materials such as, but not limited to, tetrahedral amorphous carbon (TAC), $Al_2O_3$, $TiO_2$, $Ta_2O_5$, and $SiO_2$. This combination provides for high rate depositions of optical quality thin-films on temperature-sensitive substrates. The application of a DC or RF bias (for conductive and non-conductive substrates, respectively) is necessary to the deposition of the films. This DC or RF bias is applied to the substrate holder which is electrically isolated from the chamber.

BRIEF DESCRIPTION OF THE DRAWINGS

There now follows a description of specific embodiments of the invention in which:

FIGS. 12–14 depict deposition apparatus and a scanning assembly.

DETAILED DESCRIPTION OF THE PREFERRED EMBODIMENTS

Figure 1:
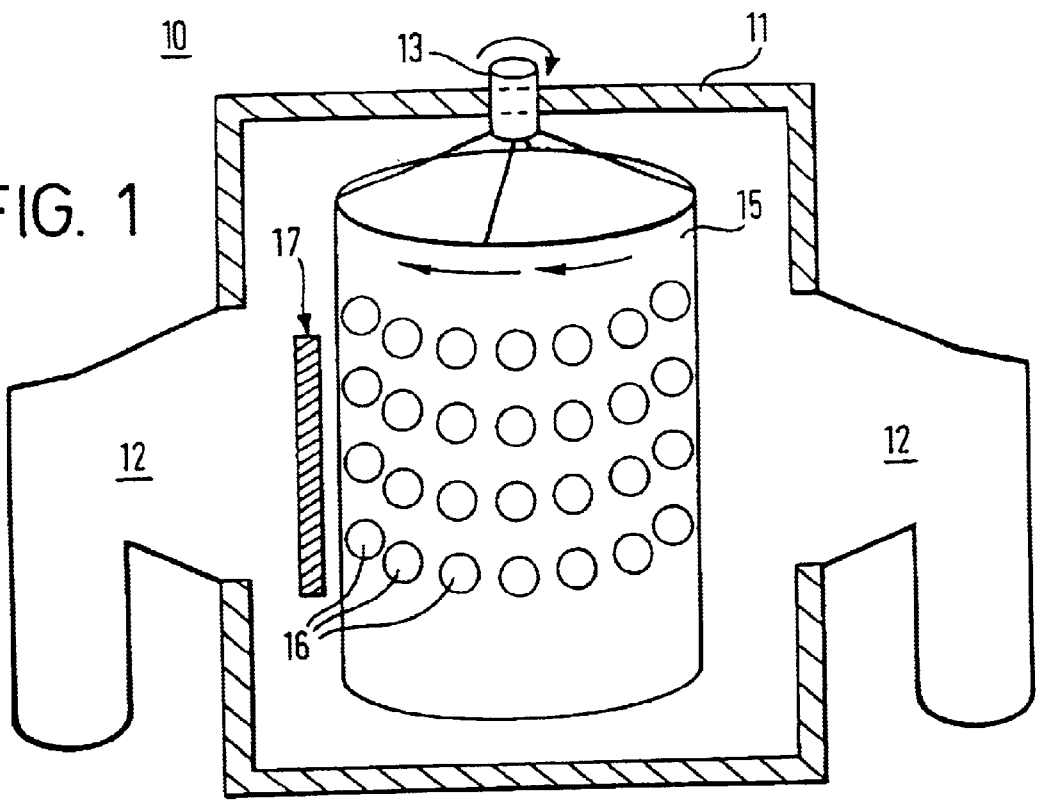
FIGS. 1 and 2 are, respectively, a simplified schematic perspective view and a simplified schematic horizontal sectional view, of a single-rotational cylindrical drum FCA vacuum coating system which embodies the principles of our present invention.
Figure 2:
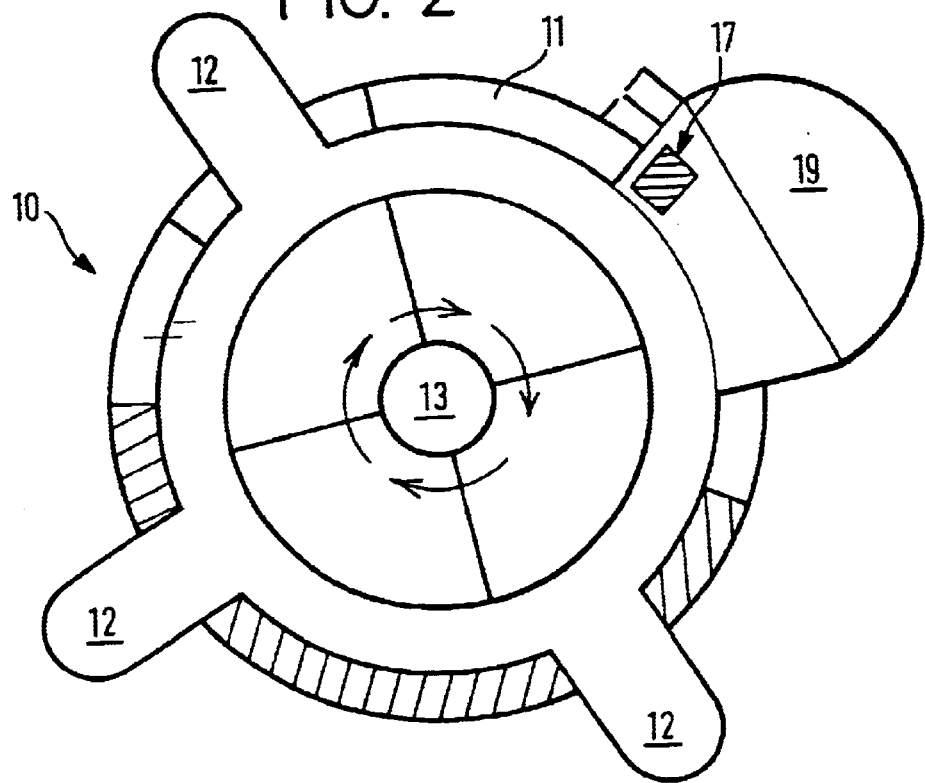
Figure 3:
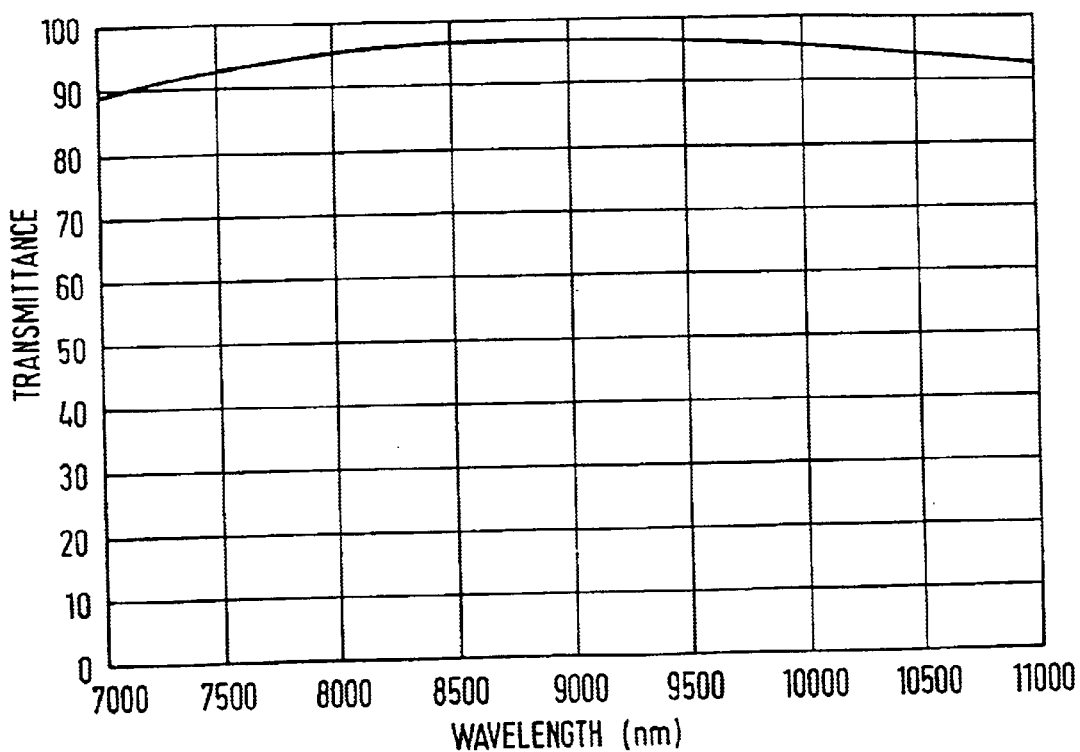
FIGS. 3–8 depict calculated the transmission or reflectance curves for a single layer of TAC deposited on a Germanium substrate (FIG. 3), a multi-layer anti-reflection coating on Germanium consisting of TAC and Ge (FIG. 4), a multi-layer antireflection coating on either glass or plastic substrates consisting of TAC and $SiO_2$ (FIG. 5), a multi-layer, anti-reflection coating on either glass or plastic substrates consisting of TAC, $Al_2O_3$, and $SiO_2$ (FIG. 6), a transmission curve of multi-layer laser mirror coating consisting of TAC and $SiO_2$ (FIG. 7), and a reflection curve of the same multi-layer laser mirror coating consisting of TAC and $SiO_2$ (FIG. 8)
Figure 4:
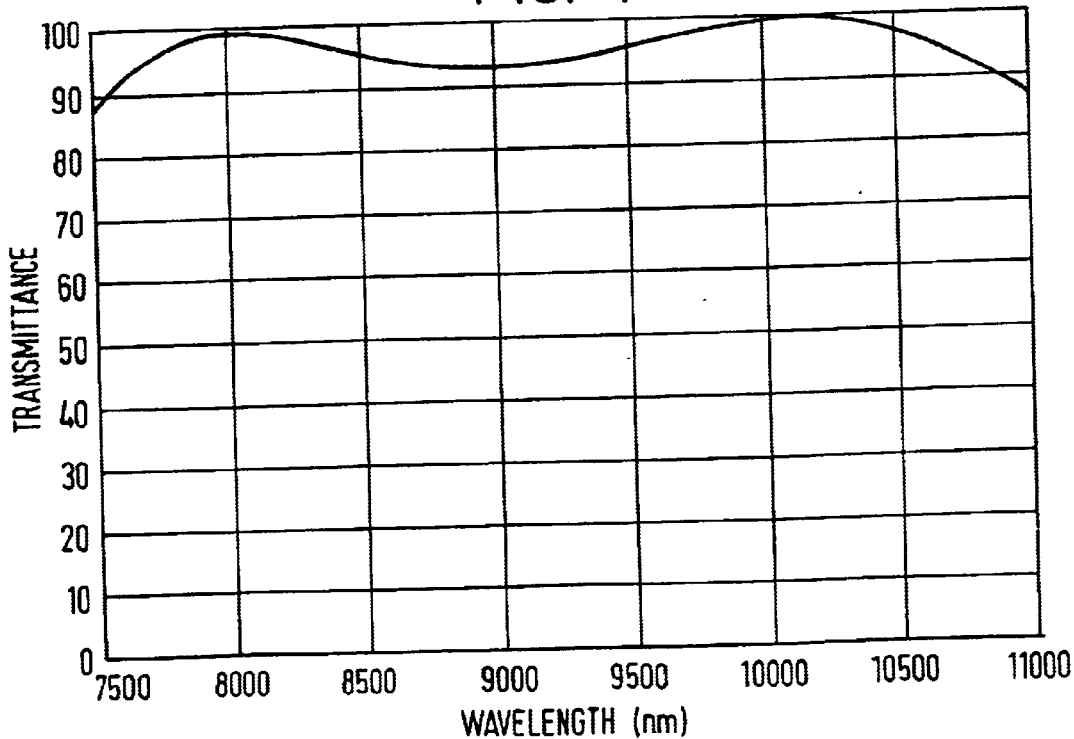

FIGS. 1 and 2, respectively, depict a simplified schematic perspective view and a horizontal sectional view of a single rotation embodiment of our FCA vacuum system. The illustrated FCA system (10) comprises a housing (11) which forms a vacuum processing chamber and is connected to a suitable vacuum pumping system (19) shown in FIG. 2. The vacuum pumping system includes a suitable vacuum pump or combinations thereof for exhausting and pumping down the vacuum chamber to a vacuum of at least $10^{-6}$ Torr and a mechanical pump for vacuum regeneration, as is conventional with vacuum chambers. The chamber is mounted on a frame comprising a rack for instruments and a control panel having electrical connections to sensors in and around the chamber to monitor chamber pressure, arc power supply, drum motor power supply and deposition rate. The system (10) also includes a cage-like drum (15) which is mounted for rotation about shaft (13) and has a cylindrical side which is adapted for mounting substrates (16) of various configurations. The substrates (16) can be mounted directly on the drum (15) facing outwardly toward the FCA sources (12) and the linear ion source (17) which are spaced about the external periphery of the drum (15).

The rotating drum (15) is located within a vacuum chamber that is roughly cylindrical and has a port allowing access to a cylindrical drum mounted within the chamber. The chamber diameter is approximately 24 inches (50 cm) and the drum diameter is approximately 15 inches (38 cm). The drum is approximately 15 inches (38 cm) high.

The drum is rotated via a vacuum rotary feed-through, allowing rotational drive to be imparted to the drum without breaking vacuum in the chamber. An electric motor (not shown) is located on top of the chamber to drive rotation of the drum via a central shaft attached to the drum and projecting out of the chamber through the vacuum rotary feed-through. The drum is mounted on bearings on the bottom of the chamber.

Three filtered cathode arc sources (12) are attached to the vacuum chamber at distal ends of their respective plasma ducts, these distal ends meeting the vacuum chamber wall at rectangular openings approximately 7 inches wide and 12 inches high (18 cm wide and 30 cm high). In both cases, the distal plasma ducts of the filtered cathode arc sources are attached to the wall of the chamber such that when no plasma beam scanning is taking place the plasma beam is normal to the chamber wall and normal to the cylindrical drum. The filtered cathode arc sources comprise double bend plasma ducts for filtering macroparticles from the plasma beam. The plasma ducts are approximately 6 inches (15 cm) in diameter, increasing at their distal ends to a rectangle of 7 inches wide and 12 inches high (18 cm wide and 30 cm high) to allow for scanning of the beams.

The cathode arc sources (12) are located, when viewed from above approximately 90 degrees apart and operate independently of each other. Each can provide a deposition rate of 15 angstroms per second over an area of 25 in$^2$ (157 cm$^2$) at an arc current of 70A.

Each filtered cathode arc source has a water cooled anode and a water cooled cathode, and also water cooling for the coils providing magnetic steering fields for the double bends. Each filtered cathode arc source can operate continuously, i.e. until the cathode target is substantially consumed.

A deposition rate monitor (not shown) is located inside the drum and attached to a central rod inside the drum, and having electrical connections via the vacuum feed-through to the control panel. Apertures in the surface of the cylindrical drum allow ions from the plasma beam to impinge upon the deposition rate monitor and allow accurate monitoring of deposition rate.

The drum is electrically insulated from the chamber and the apparatus allows the operator the option of applying a DC bias or an RF bias to the drum. The apparatus allows a bias of up to 1000 volts to be applied to the drum, applied through the drum shaft.

In use, the filtered cathode arc sources can be used simultaneously to obtain high deposition rates of diamond-like carbon films having low macroparticle counts. While the deposition apparatus of this specific embodiment uses three filtered cathode arc sources, it would be a matter of routine for a person of skill in the art to prepare apparatus having only one, or two or more than two filtered cathode arc sources. Of practical concern, an additional source can be located on the door of the vacuum chamber.

Figure 5:
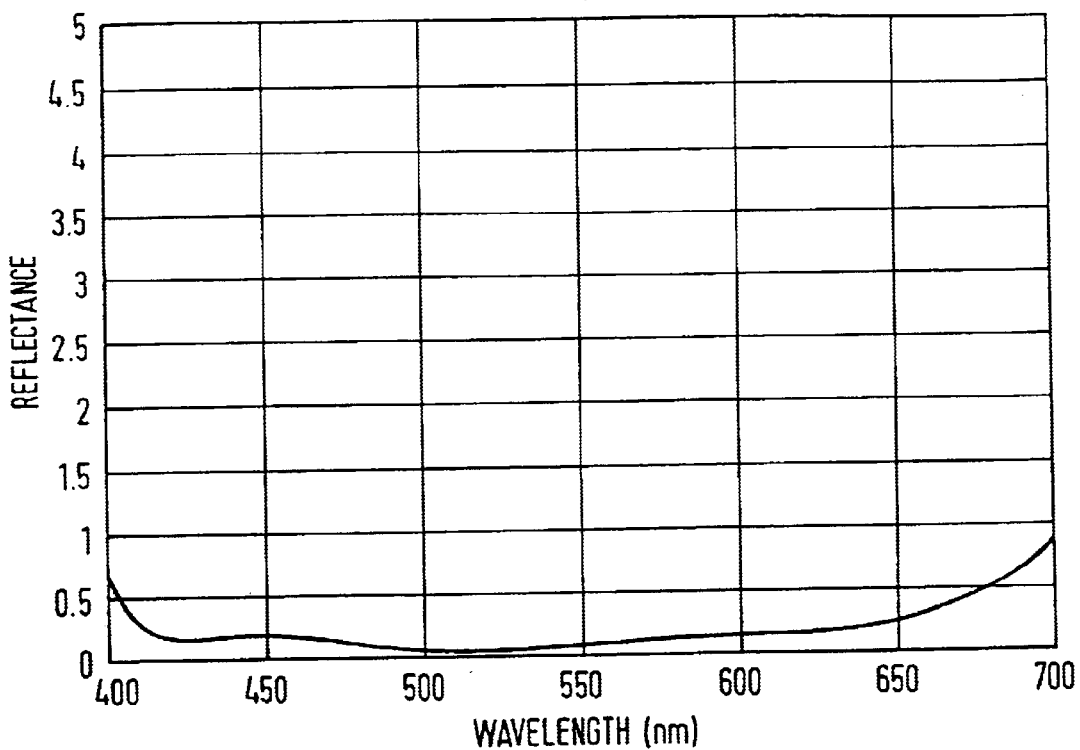
Figure 6:
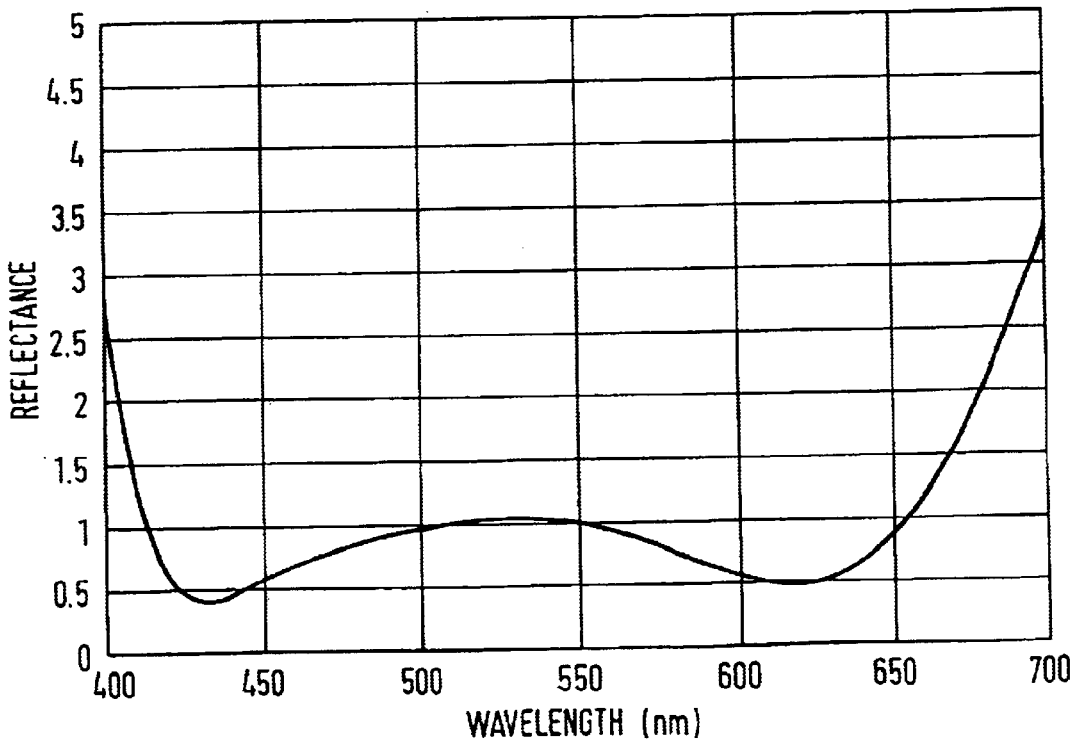
Figure 7:
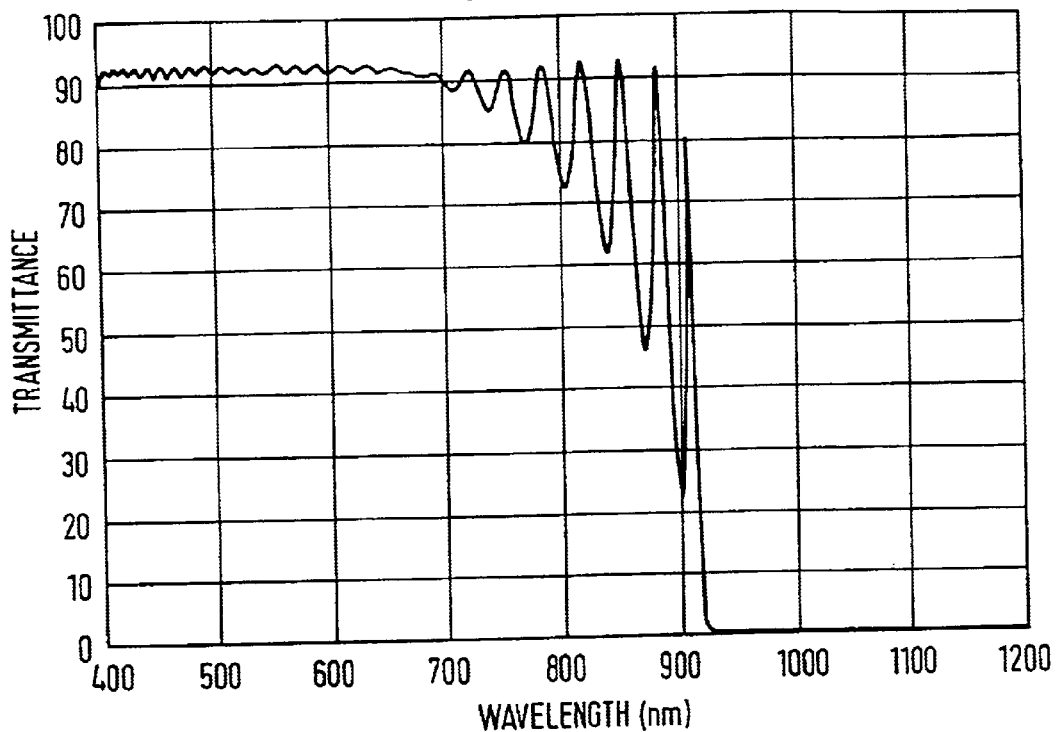
Figure 8:
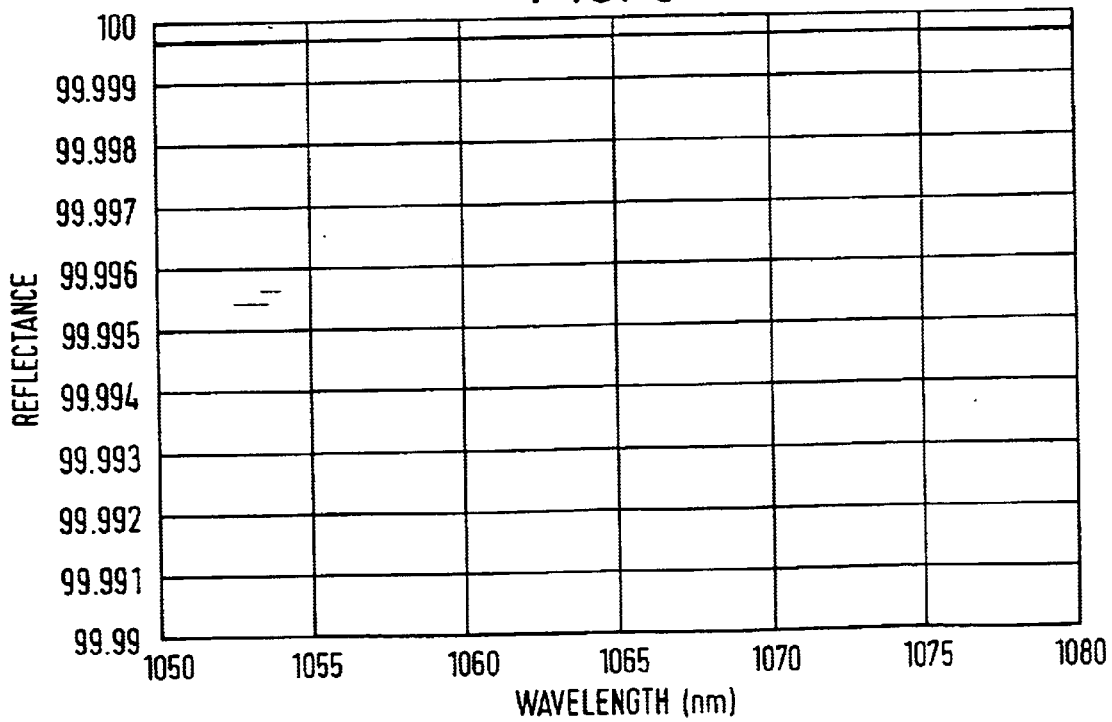

The deposition apparatus of the specific embodiment is also used to deposit multi-layer coatings on to a substrate without breaking vacuum in the vacuum chamber. To obtain such multi-layer coatings, one filtered cathode arc source is operated using a target such as graphite, producing a diamond-like carbon first layer, and the second filtered cathode arc source is not operated during deposition of the first layer but is thereafter operated using a different target, such as silicon with injection of oxygen gas to obtain a silica layer on top of the diamond-like carbon layer. The calculated reflectance of such a multi-layer coating is shown in FIG. 5.

Each filtered cathode arc source has a filter duct between the cathode target and the substrate, and a magnetic steering field provided by coil windings around the duct to steer positive ions through the duct.

The invention is of use in providing the following coatings:
1. Germanium and Silicon for infrared Applications: Rain Erosion Protective Multi-layer Coatings.
2. Zinc Sulphide and Zinc Selenide for Infrared Applications.
3. Glass Eyeglass Lenses.
4. Plastic Eyeglass Lenses.
5. Anti-Reflective Coatings for Plastics.
6. Multi-Layer Designs for a Variety of Substrates.
7. Tool Hardening Applications.
8. Protective Coating for Hard Disk Drives.
9. Medical Applications: Durable, frictionless Artificial Joints.
10. Hard Smooth Coatings for Tape Reading Heads.
11. Car Panels, Windscreens.

Figure 9:
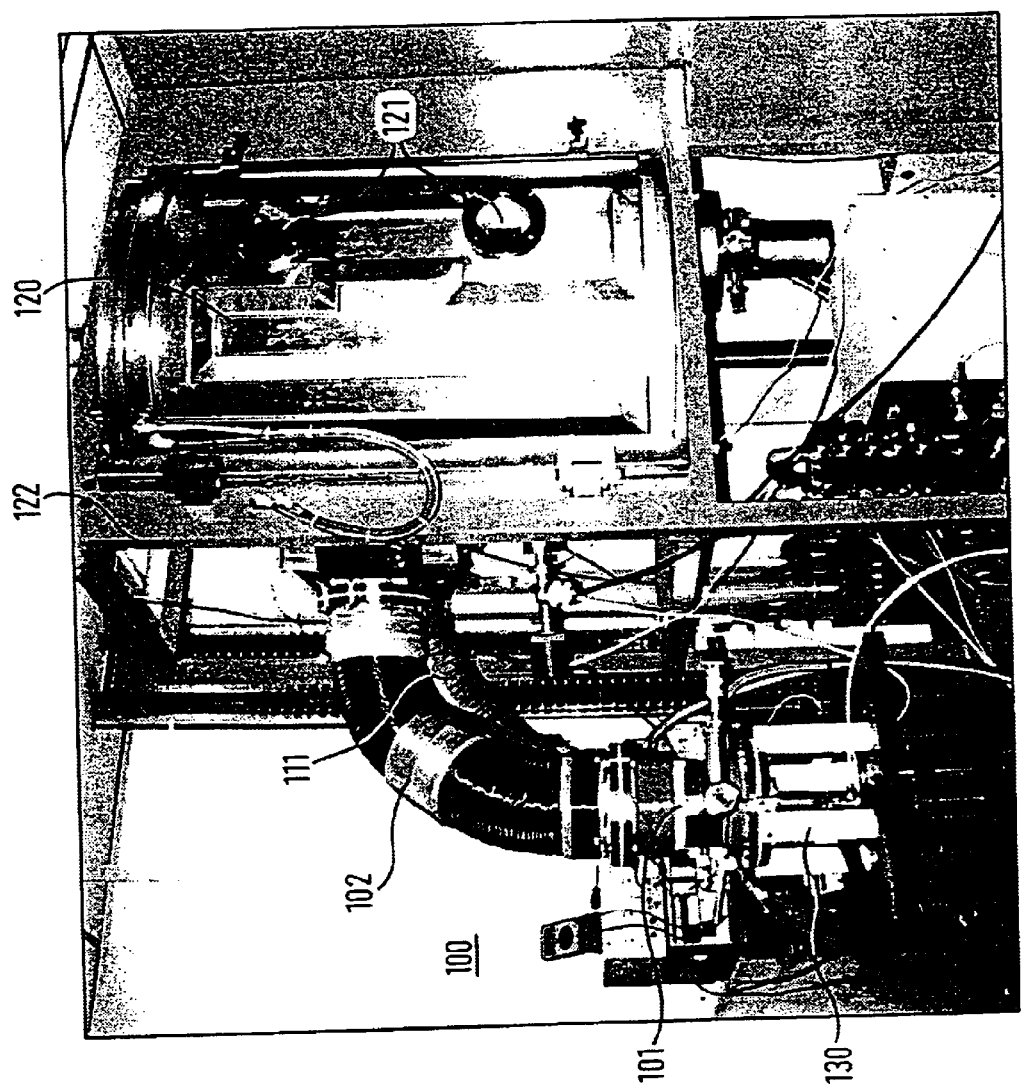
FIGS. 9 and 10 are photographs of deposition apparatus according to the invention.
Figure 10:
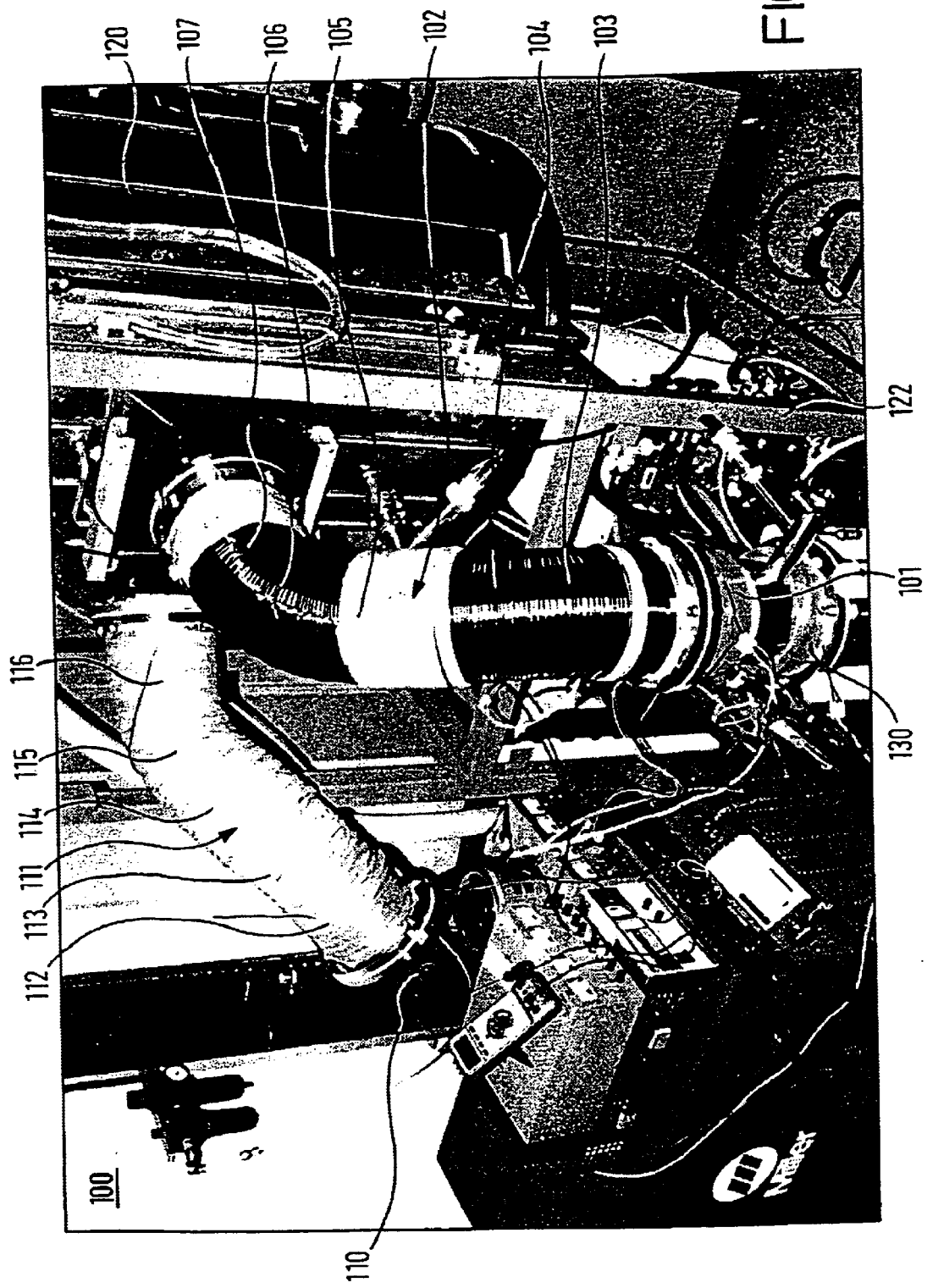

Referring to FIGS. 9 and 10, deposition apparatus (100) comprises a vacuum chamber (120) and two FCA sources (102, 111). The first source (102) has a cathode and anode (101) for generating an arc from a target (not shown). Positive ions from the target are filtered by a double bend duct comprising a first straight section (103), a first bend (104), a second straight section (105), a second bend (106) and a third straight section (107) that opens into the vacuum coating chamber (120). Both ducts are toroidal in cross-section and have a double bend preventing a line-of-sight from the target to the substrate and preventing also a single bounce path from the target to the substrate. Ports (121) on the chamber allow visual inspection of substrates mounted on a rotatable drum (not shown) inside. Positive ions are steered through the duct by a magnetic field produced from coil windings around the whole length of the duct.

The first bend (104) has an angle of 50 degrees and the second bend (106) has an angle of 60 degrees. These two bends are in different planes, such that the resultant angle between (i) plasma entering the duct and passing through the first straight section (103) and (ii) plasma passing through the third straight section and exiting the duct is 90 degrees.

Likewise, positive ions from the second source are filtered by a double bend duct having first, second and third sections (112, 114, 116) and first and second bends (113, 115). In the case of the second source, the first bend (113) has an angle of 35 degrees, the second bend (115) has an angle of 40 degrees and the resultant angle between the first and third straight sections (112, 116) is 45 degrees.

Figure 11:
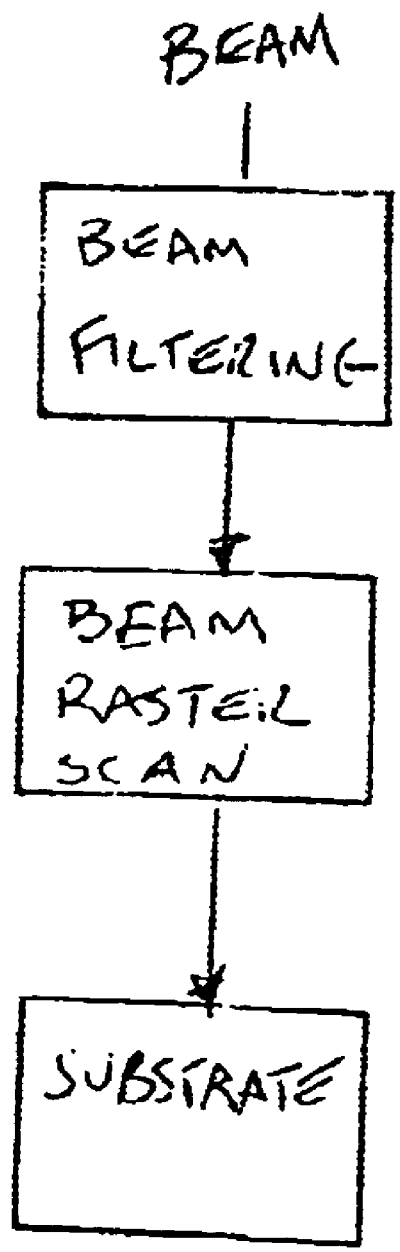
FIG. 11 depicts scanning occurring downstream of filtering.

A frame (122) bears the coating chamber and the two FCA sources. Other aspects of the apparatus are as described for FIGS. 1 and 2. FIG. 11 diagrammatically depicts that the scanning of the plasma beam occurs downstream of the beam filtering.

Variations and modifications from the described specific embodiments will be apparent from the description to a person of skill in the art and consequently the invention is not to be construed as limited to any specific embodiment.

Figure 14:
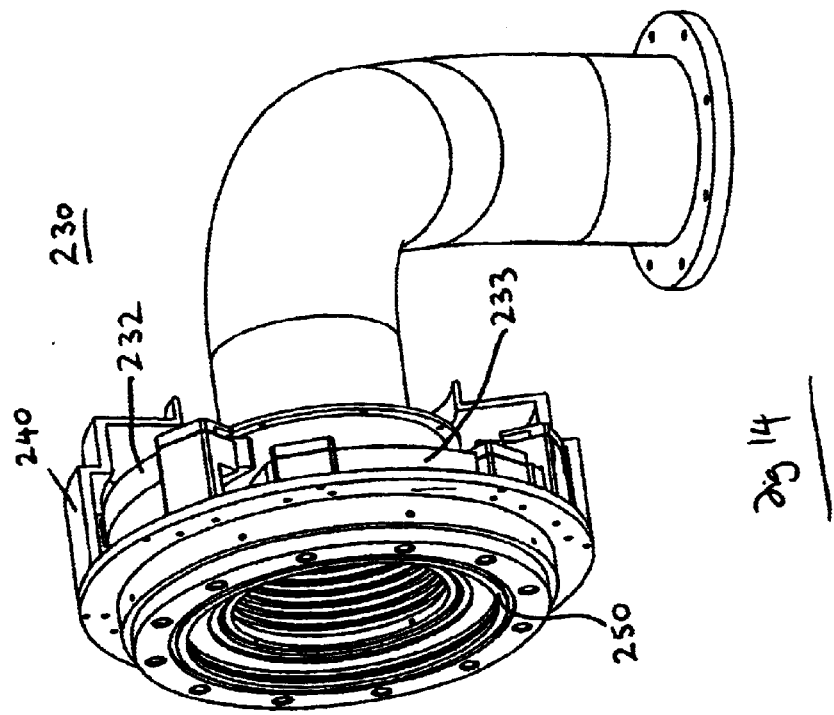
Figure 13:
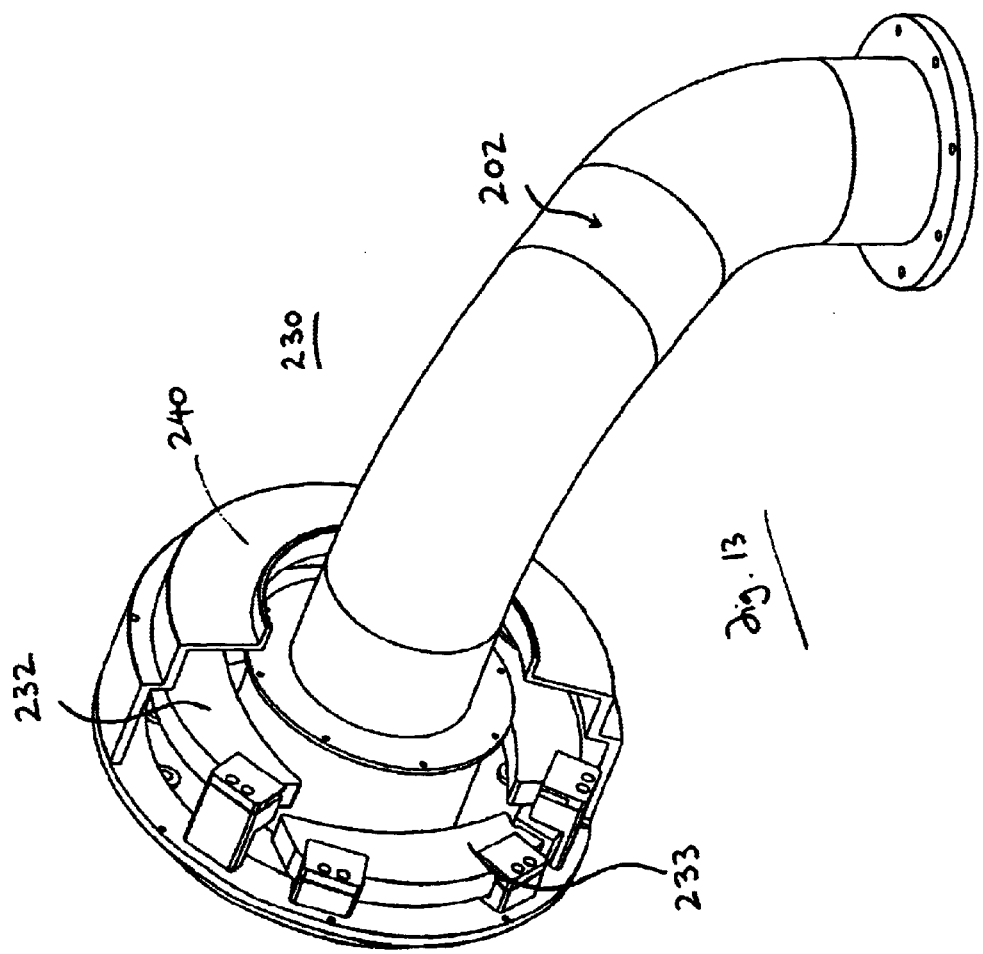

Referring to FIGS. 12, 13 and 14, deposition apparatus (200) comprises a vacuum chamber (220) and two FCA sources (202, 211). The first source (202) has a cathode and anode (201) for generating an arc from a target (not shown). Positive ions from the target are filtered by a double bend duct comprising a first straight section (203), a first bend (204), a second straight section (205), a second bend (206) and a third straight section (207) that opens into the vacuum coating chamber (220). Both ducts are toroidal in cross-section and have a double bend preventing a line-of-sight from the target to the substrate and preventing also a single bounce path from the target to the substrate. Ports (221) on the chamber allow visual inspection of substrates mounted on a rotatable drum (not shown) inside. Positive ions are steered through the duct by a magnetic field produced from coil windings around the whole length of the duct.

The first bend (204) has an angle of 50 degrees and the second bend (206) has an angle of 60 degrees. These two bends are in different planes, such that the resultant angle between (i) plasma entering the duct and passing through the first straight section (203) and (ii) plasma passing through the third straight section and exiting the duct is 90 degrees.

Likewise, positive ions from the second source are filtered by a double bend duct having first, second and third straight sections (212, 214, 216) and first and second bends (213, 215). In the case of the second source, the first bend (213) has an angle of 35 degrees, the second bend (215) has an angle of 40 degrees and the resultant angle between the first and third straight sections (212, 216) is 45 degrees.

A frame (222) bears the coating chamber and side-supports (223,224) bear the two FCA sources. Other aspects of the apparatus as described for FIGS. 1, 2, 9 and 10.

A scanning means assembly (230,231) is shown generally in FIG. 12 and in more detail in FIGS. 13 and 14. A first core (232) in combination with a coil and controlling electronics (not shown) provides y-axis scanning and a second core (233) in combination with a coil and control electronics (not shown) provides x-axis scanning. The scanning assembly is protected in use by shield (240) shown in partly cut-away form on FIGS. 13 and 14, and shown completely in FIG. 12. An o-ring seal (250) seals the connection of the filter duct to the deposition apparatus.

The x-axis and y-axis scanning form a raster, that is, a predetermined pattern of scanning that provides substantially uniform coverage of an area. Each scanning line is repetitively generated by sweeping or moving the plasma beam.

It will be understood that each of the elements described above, or two or more together, also may find a useful application in other types of constructions differing from the types described above.

While the invention has been illustrated and described as embodied in a filtered cathode arc source deposition apparatus, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be protected by Letters Patent is set forth in the appended claims.

We claim:

1. An apparatus for applying a coating of positive ions to a substrate having a coating area to be coated, the apparatus comprising:
    a) a vacuum chamber;
    b) a holder in the vacuum chamber for supporting the substrate;
    c) a filtered cathodic arc source for directing a plasma beam containing the positive ions toward the substrate, the plasma beam having a cross-sectional beam area on the substrate which is smaller than the coating area on the substrate, said cathodic arc source including a duct having two bends, one of the bends lying in a first plane, and the other of the bends lying in a second plane which is not coincident with the first plane; and
    d) scanning means for moving the beam in a raster scan across the substrate to coat the coating area.

2. The apparatus of claim 1, wherein the holder is a rotary drum for moving the substrate relative to the beam.

3. The apparatus of claim 2, wherein the substrate is mounted on a peripheral surface of the drum.

4. The apparatus of claim 1, wherein the holder is movable, and further comprising a plurality of additional substrates mounted on the movable holder.

5. The apparatus of claim 1, wherein the scanning means is operative for generating a magnetic field for moving the beam at one scanning frequency in a first one of two mutually orthogonal directions, and at another scanning frequency in the other of the directions.

6. The apparatus of claim 5, wherein each scanning frequency lies in a range of 2–100 Hz.

7. The apparatus of claim 1, and further comprising an additional filtered cathodic arc source for directing an additional plasma beam toward the substrate, the additional plasma beam having a cross-sectional additional beam area on the substrate which is smaller than the coating area on the substrate; and an additional scanning means for moving the additional beam in a raster scan across the coating to coat the coating area on the substrate with an additional coating.

8. The apparatus of claim 1, wherein the cathodic arc source includes an interchangeable cathode.

9. The apparatus of claim 1, and further comprising means for applying an electrical bias to the substrate.

10. The apparatus of claim 9, wherein the bias is a DC voltage.

11. The apparatus of claim 9, wherein the bias is an RF signal.

12. The apparatus of claim 1, wherein the substrate is a dielectric substrate; said apparatus further comprising means for applying a radio frequency bias to the dielectric substrate to dissipate electrostatic charge accruing during coating of the coated area.

13. The apparatus of claim 12, wherein the dielectric substrate is an optical element.

14. An apparatus for applying a coating of positive ions to a plurality of substrates each substrate having a coating area to be coated, the apparatus comprising:
    a) a vacuum chamber;
    b) a holder in the vacuum chamber for supporting the plurality of substrates;
    c) a plurality of filtered cathodic arc sources for directing respective plasma beams each containing the positive ions towards the substrates, each plasma beam having a cross-sectional beam area on a respective substrate which is smaller than a respective coating area on the respective substrate, each of said cathodic arc sources including a duct having two bends, one of the bends in each duct lying in a first plane pertaining to that duct, and the other of the bends lying in a second plane which pertains to that duct and is not coincident with the first plane pertaining to that duct;
    d) scanning means for moving the beams in respective raster scans across the substrates to coat the respective coating areas of the substrates; and
    e) drive means for moving the holder relative to the beams.

15. The apparatus of claim 14, wherein the apparatus includes means for simultaneously operating the plurality of arc sources.

16. An apparatus for applying a coating of positive ions to a substrate having a coating area to be coated, the apparatus comprising:
    a) a vacuum chamber;
    b) a holder in the vacuum chamber for supporting the substrate;
    c) a filtered cathodic arc source for directing a plasma beam containing the positive ions toward the substrate, the plasma beam having a cross-sectional beam area on the substrate which is smaller than the coating area on the substrate, said cathodic arc source including a duct having first and second bends, and a straight section between the bends, the bends preventing a line of sight from the cathodic arc source to the substrate and preventing also a single bounce path from said source to said substrate;

d) scanning means for moving the beam in a raster scan across the substrate to coat the coating area on the substrate; and e) drive means for moving the holder relative to the beam.

17. An apparatus for applying a coating of positive ions to a substrate having a coating area to be coated, the apparatus comprising:

a) a vacuum chamber;

b) a holder in the vacuum chamber for supporting the substrate;

c) a cathode arc source for directing a plasma beam containing the positive ions towards the substrate, the cathode arc source including a duct having first and second bends, and a straight section between the bends, the bends preventing a line of sight and a single bounce path from the cathode arc source to the substrate; and d) scanning means comprising means for scanning the beam in a y-axis, and means for scanning the beam in an x-axis across the substrate to coat the coating area.

18. The apparatus according to claim 17, wherein the scanning means is operative for generating magnetic fields for moving the beam at a scanning frequency of from 2–100 Hz in the y-axis and at a frequency of from 2–100 Hz in the x-axis.

19. The apparatus according to claim 17, wherein the first and second bends lie in non-coincident planes.

* * * * *